United States Patent [19]

Bryan et al.

[11] Patent Number: 5,428,634
[45] Date of Patent: Jun. 27, 1995

[54] VISIBLE LIGHT EMITTING VERTICAL CAVITY SURFACE EMITTING LASERS

[75] Inventors: Robert P. Bryan; Gregory R. Olbright, both of Boulder, Colo.; James A. Lott; Richard P. Schneider, Jr., both of Albuquerque, N. Mex.

[73] Assignee: The United States of America as represented by the United States Department of Energy, Washington, D.C.

[21] Appl. No.: 972,820

[22] Filed: Nov. 5, 1992

[51] Int. Cl.$^6$ .................................................. H01S 3/19
[52] U.S. Cl. ........................................ 372/45; 372/46; 372/96
[58] Field of Search ............................. 372/45, 46, 96

[56] References Cited

U.S. PATENT DOCUMENTS 4,949,350  8/1990  Jewell et al. ........................... 372/45

OTHER PUBLICATIONS

J. L. Jewell et al., "Microlasers," *Scientific American*, vol. 265, No. 5, pp. 86–94, Nov. 1991.

J. L. Jewell et al., "Vertical-Cavity Surface Emitting Lasers: Design, Growth Fabrication, Characterization," *IEEE Journal of Quantum Electronics*, vol. 27, No. 6, pp. 1332–1346, Jun. 1991.

G. R. Olbright et al., "Cascadable Laser Logic Devices: Discrete Integration of Phototransistors with Surface-Emitting Laser Diodes," *Electronics Letters*, vol. 27, No. 3, pp. 216–217, Jan. 13, 1991.

J. L. Jewell et al., "Vertical Cavity Lasers for Optical Interconnects," *SPIE* vol. 1389 *International Conference on Advances in Interconnection and Packaging*, pp. 401–407, 1990 (no month available).

R. P. Schneider et al., "Visible (657 nm) InGaP/InAlGaP Strained Quantum Well Vertical-Cavity Surface-Emitting Laser," *Appl. Phys. Lett.*, vol. 60, No. 15, pp. 1830–1832, Apr. 1992.

Y. H. Lee et al., "High Efficiency (1.2mW.mA) Top-Surface-Emitting GaAs Quantum Well Lasers," *Electronics Letters*, vol. 26, No. 16, pp. 1308–1310, Aug. 2, 1990.

H. Yoo et al., "Low Series Resistance Vertical-Cavity Front-Surface-Emitting Laser Diode," *Appl. Phys. Lett.*, vol. 56, No. 20, pp. 1942–1944, May 14, 1990.

Y. H. Lee et al., "Deep-Red Continuous Wave Top-Surface-Emitting Vertical-Cavity AlGaAs Superlattice Lasers," *IEEE Photonics Technology Letters*, vol. 3, No. 2, pp. 108–109, Feb. 1991.

J. Hashimoto et al., "Effects of Strained-Layer Structures on the Threshold Current Density of AlGaInP/GaInP Visible Lasers", *Appl. Phys. Lett.*, vol. 58, pp. 879–880, 1991 (No month available).

R. S. Geels et al., "InGaAs Vertical-Cavity Surface-Emitting Lasers", *IEEE Journal of Quantum Electronics*, vol. 27, No. 6, pp. 1359–1367, Jun. 1991.

(List continued on next page.)

*Primary Examiner*—Georgia Y. Epps
*Attorney, Agent, or Firm*—Karuna Ojanen; James H. Chafin; William R. Moser

[57] ABSTRACT

A vertical cavity surface emitting laser that emits visible radiation is built upon a substrate, then having mirrors, the first mirror on top of the substrate; both sets of mirrors being a distributed Bragg reflector of either dielectrics or other materials which affect the resistivity or of semiconductors, such that the structure within the mirror comprises a plurality of sets, each having a thickness of $\lambda/2n$ where n is the index of refraction of each of the sets; each of the mirrors adjacent to spacers which are on either side of an optically active bulk or quantum well layer; and the spacers and the optically active layer are from one of the following material systems: $In_z(Al_yGa_{1-y})_{1-z}P$, InAlGaAs, AlGaAs, InGaAs, or AlGaP/GaP, wherein the optically active region having a length equal to m $\lambda/2n_{eff}$ where m is an integer and $n_{eff}$ is the effective index of refraction of the laser cavity, and the spacer layer and one of the mirrors being transmissive to radiation having a wavelength of $\lambda/n$, typically within the green to red portion of the visible spectrum.

9 Claims, 9 Drawing Sheets

OTHER PUBLICATIONS

G. R. Olbright et al., "Linewidth, Tunability, and VHF-Millimeter Wave Frequency Synthesis of Vertical-Cavity GaAs Quantum-Well Surface-Emitting Laser Diode Arrays", *IEEE Photonics Technology Letters*, vol. 3, No. 9, pp. 779-781, Sep. 1991.

P. L. Gourley et al., "Visible, Room-Temperature, Surface-Emitting Laser Using an Epitaxial Fabry-Perot Resonator with AlGaAs/AlAs Quarter-Wave High Reflectors and AlGaAs/GaAs Multiple Quantum Wells", Appl. Phys. Lett., vol. 50, No. 18, pp. 1225-1227, May 4, 1987.

Y. Nishikawa et al., "Zn Doping Characteristics for InGaAlP Grown by Low-Pressure Metalorganic Chemical Vapor Deposition", *Appl. Phys. Lett.*, vol. 53, No. 22, pp. 2182-2184, Nov. 28, 1988.

H. Hamada et al., "AlGaInP Visible Laser Diodes Grown on Misoriented Substrates", *IEEE Journal of Quantum Electronics*, vol. 27, No. 6, pp. 1483-1490, Jun. 1991.

A. Gomyo et al., "Evidence for the Existence of an Ordered State in $Ga_{0.5}In_{0.5}P$ Grown by Metalorganic Vapor Phase Epitaxy and Its Relation to Band-Gap Energy", *Appl. Phys. Lett.*, vol. 50, No. 11, pp. 673-675, Mar. 16, 1987.

M. Krijn, "Heterojunction Band Offsets and Effective Masses in III-V Quaternary Alloys", Semicond. Sci. Technol. vol. 6, pp. 27-31, 1991 (No month available).

5,428,634

VISIBLE LIGHT EMITTING VERTICAL CAVITY SURFACE EMITTING LASERS

The U.S. Government has rights in this invention pursuant to contract No. DE-AC04-76DP00789 between the United States Department of Energy and American Telephone and Telegraph (AT&T) Corporation.

FIELD OF THE INVENTION

This invention relates to semiconductor lasers and, in particular, to vertically arranged heterostructure lasers that emit electromagnetic radiation in the visible spectrum.

BACKGROUND OF THE INVENTION

Conventional edge-emitting laser diodes are well known. In these diodes, laser radiation is emitted in a plane that is a continuation of the plane of the p-n junction that forms the diode. Different types of these diodes are widely used to provide laser radiation in the infrared and visible regions. While these diodes have enjoyed considerable commercial success, they are relatively large and, as a result, are difficult to integrate with other devices.

Unlike the edge-emitting laser, the Vertical Cavity Surface Emitting Lasers (VCSELs) emit laser radiation in the direction perpendicular to the plane of the p-n junction formed in the laser diode. Considerable information concerning the structure and formation of such laser diodes is set forth, for example, in U.S. Pat. No. 4,949,350; in J. Jewell et at., "Microlasers," *Scientific American*, Vol 265, No. 5, pp. 86–94 (November 1991); in J. Jewell et al., "Vertical-Cavity Surface Emitting Lasers: Design, Growth Fabrication, Characterization," *IEEE Journal of Quantum Electronics*, Vol. 27, No. 6, pp. 1332–1346 (June 1991); in G. R. Olbright et al., "Cascadable Laser Logic Devices: Discrete Integration of Phototransistors with Surface-Emitting Laser Diodes," *Electronics Letters*, Vol. 27, No. 3, pp. 216–217 (Jan.31, 1991); and in J. Jewell et al., "Vertical Cavity Lasers for Optical Interconnects," SPIE Vol. 1389 *International Conference on Advances in Interconnection and Packaging*, pp. 401–407 (1990), all of which are incorporated herein by reference.

As set forth in certain of the above-referenced publications, vertical cavity lasers have numerous advantages over edge-emitting lasers, some of the most important of which are that they can be fabricated in extremely small sizes, e.g., on the order of one micrometer in diameter, and can be readily integrated with other devices such as transistors.

To date, however, application of vertical cavity lasers have been limited by the absence of any vertical cavity laser which emits visible laser radiation. This invention is the realization of visible VCSEL because of the difficulties associated with the growth of InAlGaP materials, as well as the VCSEL device structure. Indeed, integration of high efficiency InAlGaP quantum well or bulk layer active material with high reflectivity epitaxial mirror structures, with the requisite precision necessary for low-threshold lasing, represents a particularly complex and demanding materials growth challenge. Precise specification of the optical properties of the active region material is critical because of the very high gain required in VCSEL structures and the unique materials difficulties associated with the InAlGaP system. Extreme difficulty in obtaining low-resistivity p-type InAlGaP with high Al concentrations places constraints on the Al composition in the InAlGaP cladding layers in visible edge-emitting lasers and, consequently, lead to reduced heterojunction band offsets and less efficient carrier confinement.

SUMMARY OF THE INVENTION

Thus, what has been invented to is a vertical cavity surface emitting laser that emits visible radiation which comprises a substrate; a first and second mirror, each of the mirrors comprising a plurality of sets, with the first mirror formed on the substrate, each of the sets of the mirrors having a thickness of $\lambda/2n$ where n is the index of refraction of each of the sets; a first spacer, formed on the first mirror; an active layer of one of the following material systems: $In_z(Al_yGa_{1-y})_{1-z}P$, InAlGaAs, AlGaAs, or InGaAs, formed on the first spacer; a second spacer formed on the active layer, wherein the second mirror is formed on the second spacer, and wherein the first and second mirrors define therebetween a laser cavity having a length equal to m $\lambda/2n_{eff}$ where m is an integer and $n_{eff}$ is the effective index of refraction of the laser cavity, and the second spacer and the second mirror being made of materials that are transmissive to radiation having a wavelength of $\lambda/n$, typically within the green to red portion of the visible spectrum.

DETAILED DESCRIPTION

Reference is made to a publication, Schneider R. P. et at., "Visible (657 nm) InGaP/InAlGaP strained quantum well vertical-cavity surface-emitting laser," *Appl. Phys. Lett.*, Vol. 60, No. 15, pp. 1830–1832 (April 1992), which is incorporated herein by reference.

Figure 1:
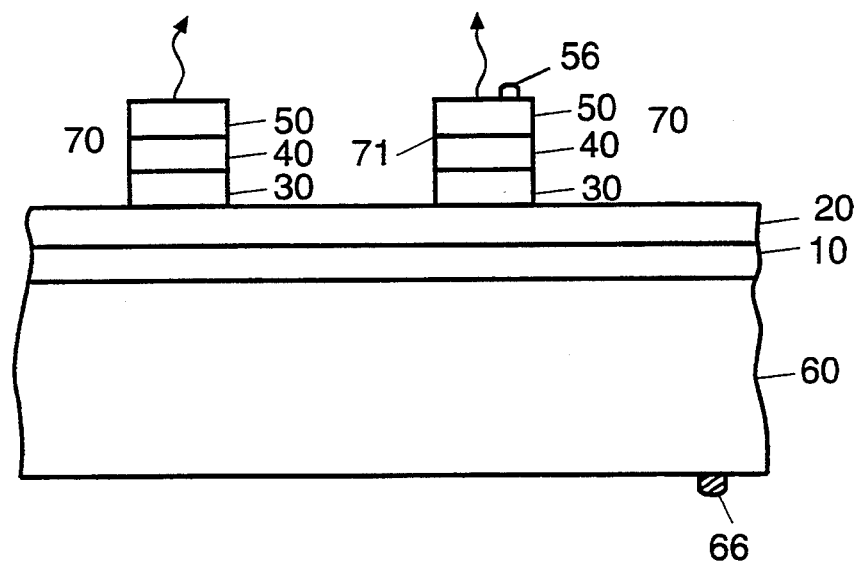
FIG. 1 is a cross section of a portion of an embodiment of the visible light vertical cavity surface emitting laser.

As shown in FIG. 1, the surface emitting laser of the present invention comprises a first mirror layer 10, a first spacer layer 20, an active layer 30, a second spacer layer 40 and a second mirror layer 50. The structures described have been grown with a substrate temperature of 750 degree C. and a substrate misorientation of 6 degrees toward the nearest <100> A because these conditions consistently yield high quality layers of InAlGaP with the highest photoluminescent emission energies and relative luminescence intensity, as well as very narrow low-temperature photoluminescent linewidths. Layers 10, 20, 30, and 40 and a portion on layer 50 are epitaxially formed on a substrate 60. The remaining portion of layer 50 may be formed either epitaxially or by dielectric deposition. As a result, layers 10, 20, 30, 40, and 50 have the same diameter as substrate 60. After epitaxial formation of the layers, active layer 30, spacer layer 40, and mirror layer 50 are defined by optical lithography and etching to form a plurality of columns 70. Electrical contacts to second mirror layer 50 and substrate 60 are provided at 56 and 66.

Figure 6:
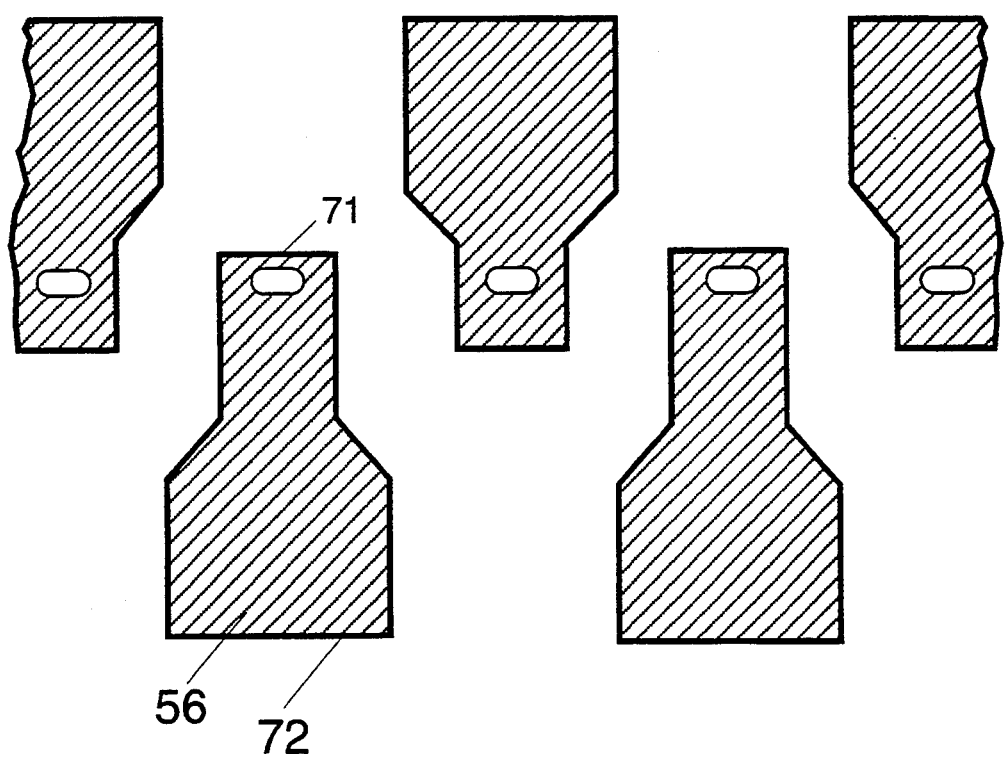
FIG. 6 is a top view of a portion of the surface emitting laser of FIG. 1.
Figures 7A, 7B:
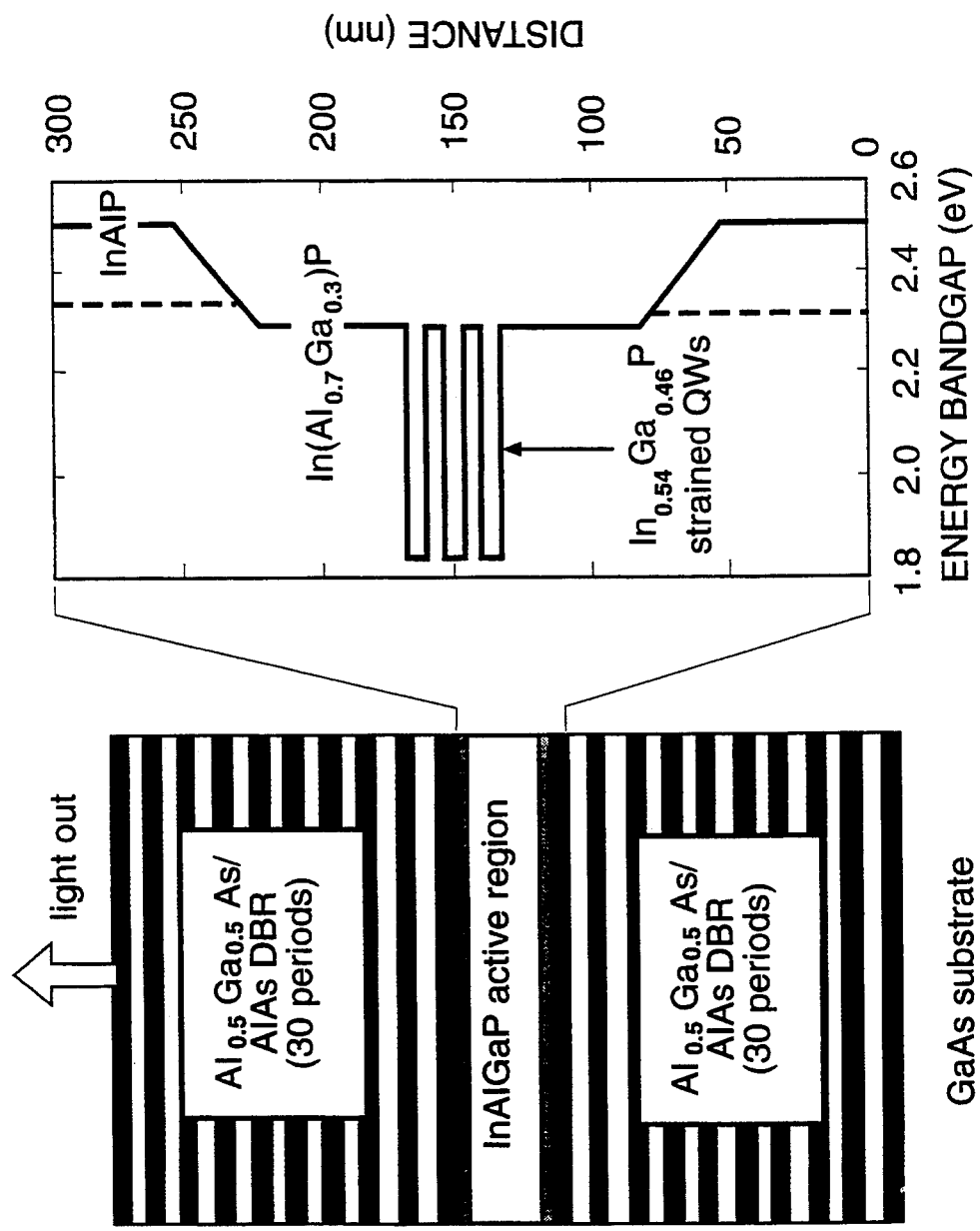
FIG. 7a illustrates the periodic structure of the mirror layers and the active region.
FIG. 7b shows the energy bandgap of a particular embodiment of the active region of the invention of FIG. 1.
Figure 8:
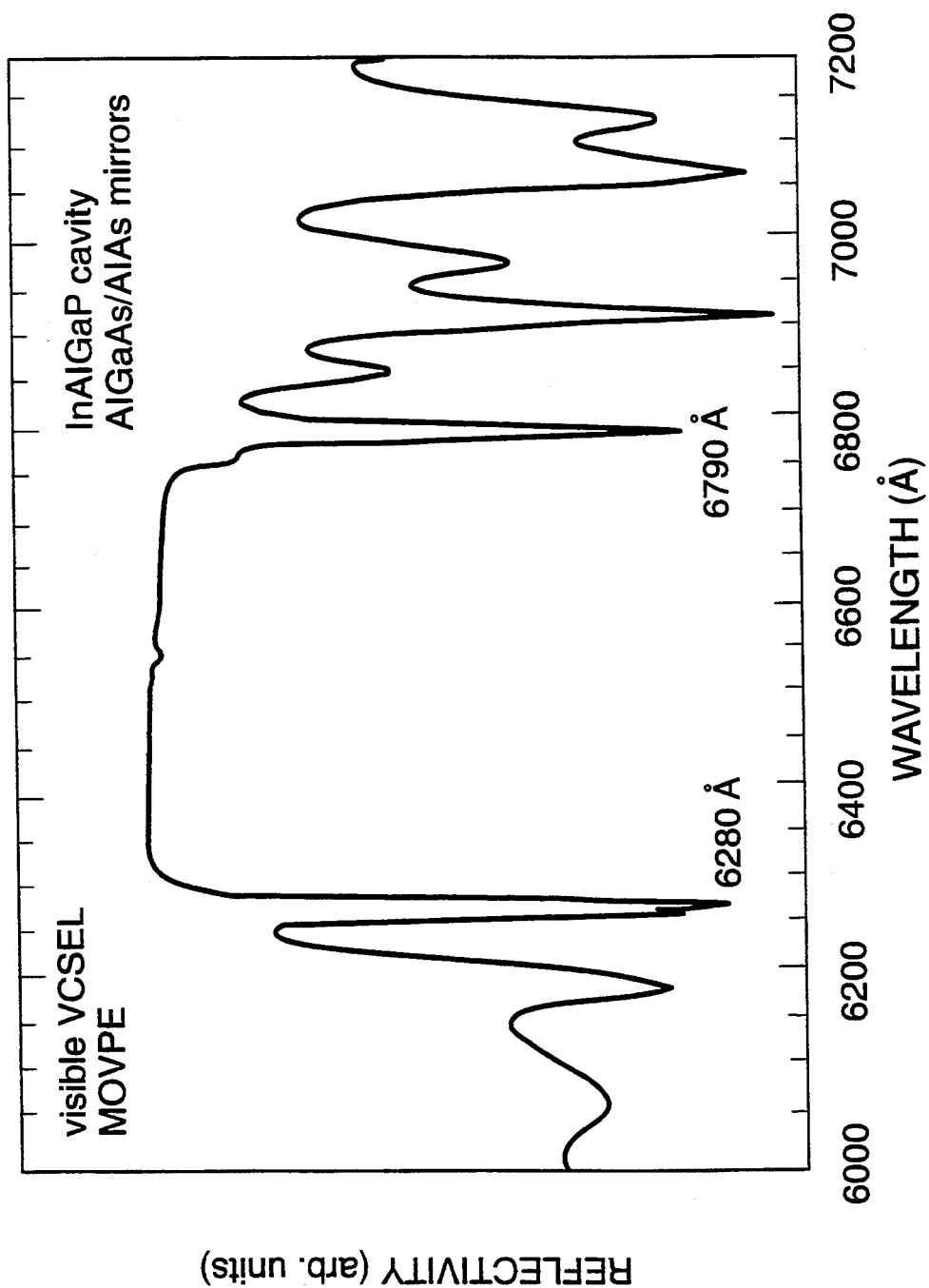
FIG. 8 is a plot of the reflectivity as a function of wavelength of one embodiment of the invention.
Figure 9:
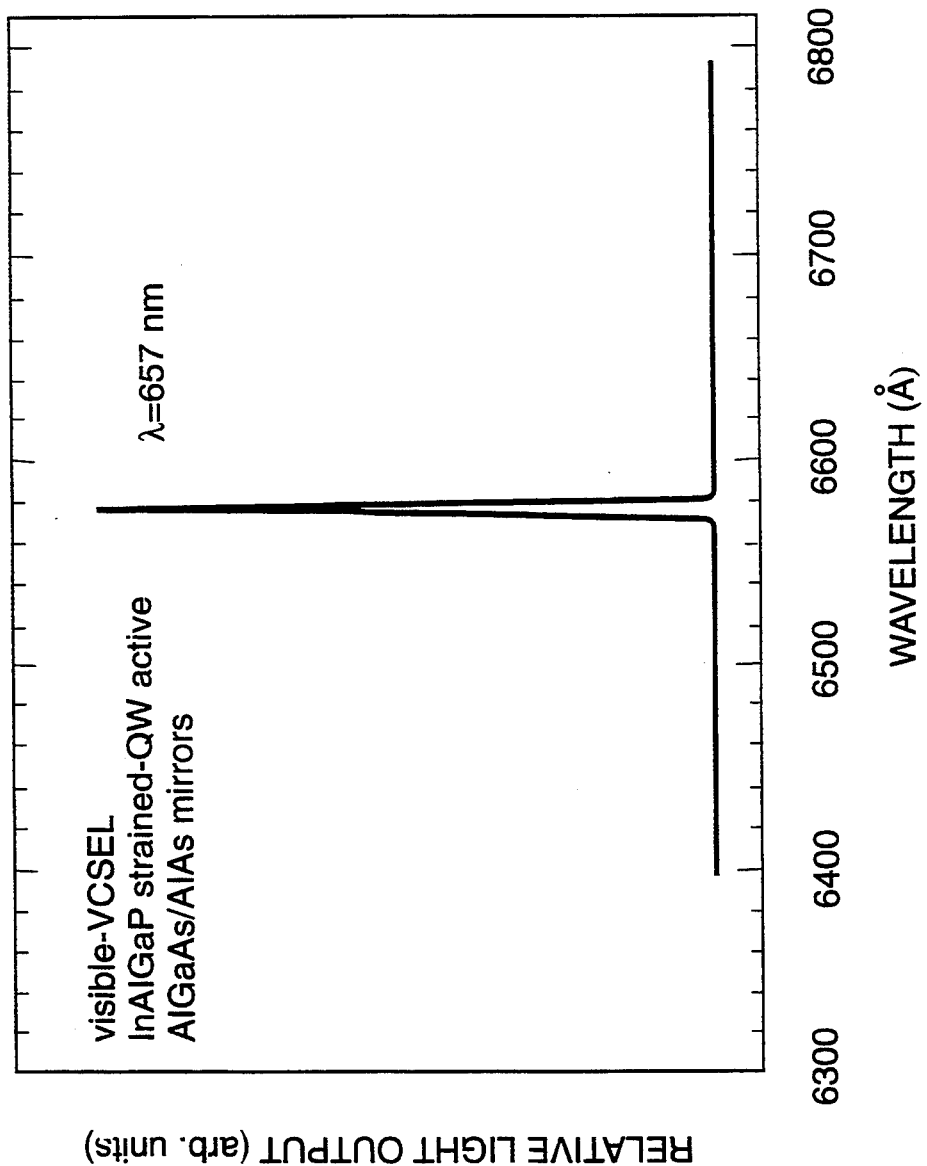
FIG. 9 is a plot of the relative light output as a function of wavelength of one embodiment of the invention.

As shown in the top view of FIG. 6, electrical contact 56 is preferably a bonding pad surmounting a portion of column 70. In this case, each column 70 has a first portion 71 (also shown in FIG. 1) this is approximately 20 micrometers on a side and a second portion 72 underneath the bonding pad that is approximately 100 micrometers on side. Illustratively, substrate 60 has a diameter of 2, 3, or 4 inches (7.5 or 10 cm.) during epitaxial processing and is diced into several units for use.

In one embodiment of the invention which is used to generate red light, substrate 60 is typically n+doped and each of layers: mirror layer 10, first spacer layer 20, active layer 30, second spacer layer 40, and second mirror layer 50 comprises a plurality of layers, the composition of which is described in more detail below. If the mirror layers 10 and 50, and the spacer and active layers 20, 30, 40 are of the AlGaAs system, then the substrate 60 can be of GaAs or AlGaAs. In the material systems wherein the mirror layers 10 and 50 and the spacer and active layers 20, 30, and 40 are of InGaAs or the InAlGaAs, the substrate 60 may be of GaAs, AlGaAs, or InP. If the mirror layers 10 and 50 and the spacer and active layers 20, 30, and 40 are from the InAlGaP materials system, then the substrate 60 may be of GaAs, AlGaAs, InP, GaP, or AlP. Examples of suitable p-type dopants include Zn or Mg, and suitable n-type dopants for these systems may be Si or C.

Figure 2:
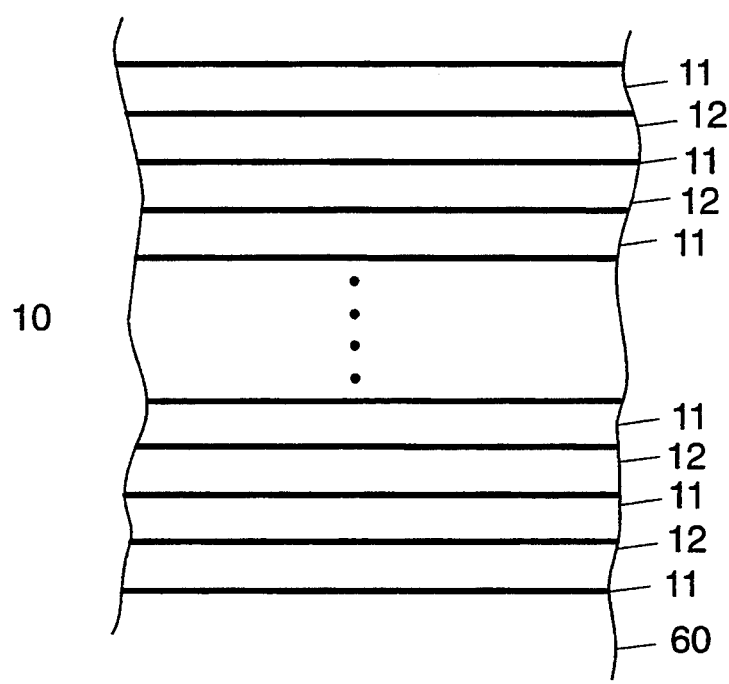
FIGS. 2–5 are cross sections of different portions of the visible light surface emitting laser of FIG. 1.

FIG. 2 illustrates only one embodiment of mirror layers 10 and 50 of the AlAs/AlGaAs material system. In general, however, mirror layers 10 and 50 comprise alternating layers 11 and 12. Each layer is quarter-wavelength thick where the wavelength is the wavelength in the layer of the radiation being emitted by the laser. As will be recognized by those skilled in the art, the construction of mirror layer 10 is that of a distributed Bragg reflector (DBR) and the alternating layers are of n+doped AlAs/AlGa. as, as shown in FIG. 2, or InAlP/InAlGaP in which the AlAs and the InAlP layer of a particular material system is the layer having the lower index of refraction and AlGaAs and InAlGaP is the layer having the higher index of refraction. As is also known, the index of refraction of AlAs and InAlP is approximately 3 to 3.2 depending on the wavelength, and the index of refraction of AlGaAs and InAlGaP ranges from approximately 3.0 to 3.6 depending on the wavelength and the relative concentrations of Al and Ga.

The epitaxial DBRs, as shown in FIG. 2, were fabricated from $Al_xGa_{1-x}As$/AlAs quarter-wave layers. The relatively high Al composition in the high index AlGaAs layers is necessary to avoid absorption at visible wavelengths. Compared to the $Al_{0.15}Ga_{0.85}As$/AlAs minors commonly designed for 850 nm (infrared) VCSELs, the DBRs used in the present invention require that the index step between the layers be reduced, thus requiting more mirror periods, and the overall Al content of the laser structure is increased significantly, complicating growth and processing. However, the valence band offset between the mirror layers is significantly reduced (~300 meV for $Al_{0.5}Ga_{0.5}As$/AlAs compared to ~540 mev for $Al_{0.15}Ga_{0.85}As$/AlAs). DBRs composed on $In(Al_yGa_{1-y})P$/$In0.52Al_{0.48}P$ where y~0.2 may also be used for visible VCSEL structures. The index step should be somewhat smaller than for $Al_{0.5}Ga_{0.5}As$/AlAs mirrors, and the Al content in the structure is substantially reduced. In addition, the $In(Al_{0.2}Ga_{0.8})P$/InAlP valence band offset ~250 meV) is expected to be even smaller than that for $Al_{0.5}Ga_{0.5}As$/AlAs (~300 meV), leading to further reduction in the electrical resistivity of the p-type mirrors. However, difficulties in composition control of In-containing compounds and preparation of low-resistivity p-type InAlP are well known to those skilled in the art.

When using the phosphide material system, it is also advantageous to use a combination of a phosphide optically active region and several mirror layers of phosphide layers immediately adjacent to the phosphide active region and then encountering structurally the DBR mirrors of As.

Non-semiconductor layers may also constitute the DBR mirror layers 10 and 50. For example, mirror layers 10 and 50 may comprise multiple layers wherein each mirror layer set is one-half wavelength. In the example shown in FIG. 2 and discussed above, the mirror set was alternating quarter-wavelength layers of high and low refractive index AlGaAs/AlAs or InAlGaP/InAlP. A mirror set, however, may be graded and could comprise, for example, three, four layers or other multiple layers of various thicknesses, e.g., two thick layers and one thin layer of insulators, dielectrics, metals, or semiconductors so long as a mirror set is one-half wavelength. These alternative mirror structures reduce the electrical resistance through the mirror stacks 10 and 50. Suitable dielectrics are, for example, $SiO_2$, $TiO_2$, $Nb_2O_5$, ZnCe and $CaF_2$, $ZrO_2$, which provide a difference in the indices of refraction among the layers of the mirror set, $\Delta n/n$, are transparent to the wavelength of interest, and have structural high-quality for high reflectance.

Figure 3:
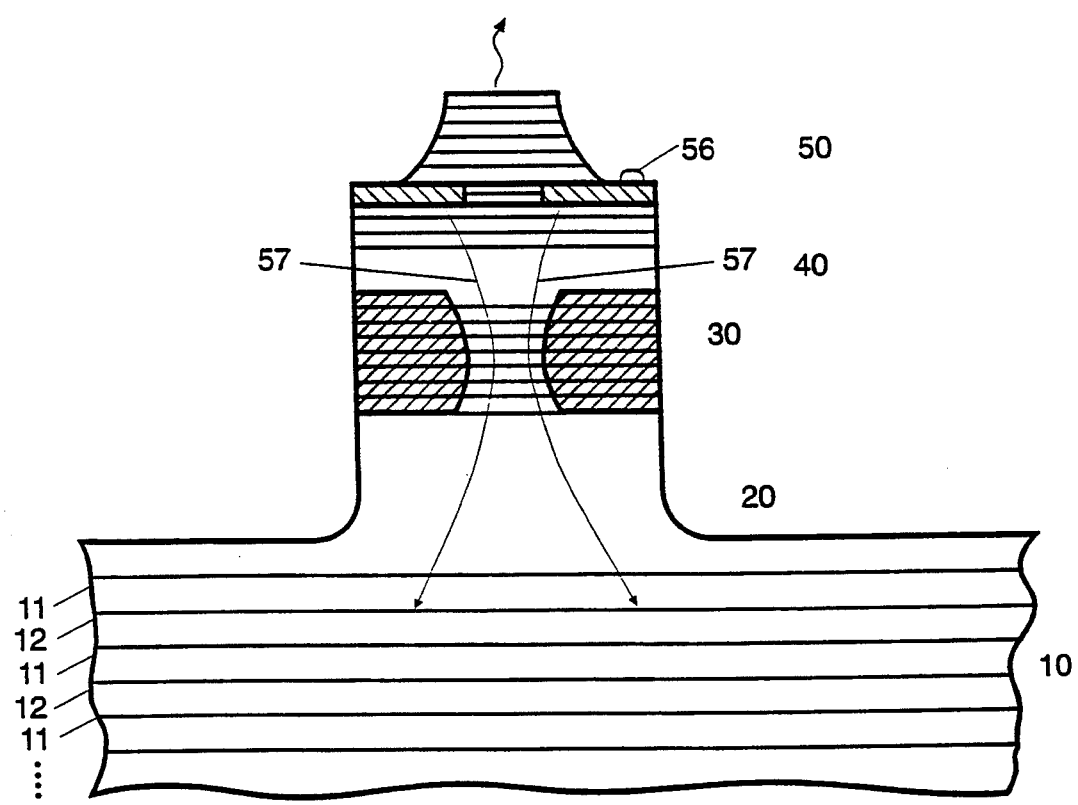

The optical gain in the VCSEL active region is also enhanced by the active region/heterostructure design. As shown in FIG. 3, the laser cavity comprises spacer layer 20, active layer 30, and spacer layer 40. The active layer 30 may be a bulk layer or, preferably a quantum well layer which may have multiple quantum wells positioned at the antinodes of the standing waves of the electric field. The length of the laser cavity (which is the thickness of layers 20, 30, and 40) is m $\lambda/2n_{eff}$ where $\lambda$ is the free space wavelength of laser radiation emitted, m is an integer and $n_{eff}$ is the effective refractive index of the cavity. It is advantageous to dope regions of the spacer layers 20 and 40 near the DBR/laser cavity junction to be the same conductivity type of the adjacent DBR. Moreover, to ensure that the internal electric field peaks at the quantum wells and to avoid uncertainties relating to the InAlP and AlAs relative indices of refraction, quarterwave layers of InAlP are incorporated on each side of the active region. This structural feature ensures proper alignment of the antinodes of the electric field with the quantum wells.

When the active layer 30 is a quantum well 34, it is defined by an annular zone 33 of implanted protons which surrounds the active quantum well thereby confining the electrical current flow to the active quantum well. Details of the use of ion implantation for such current funnelling are set forth in Y. H. Lee et al., "Top-Surface-Emitting GaAs Four-Quantum-Well Lasers Emitting at 0.85 micrometers," *Electron Lett.*, Vol. 26, pp. 1308–1310 (1990) and H. -J. Yoo et at., "Low Series Resistance Vertical-Cavity Front-Surface-Emitting Laser Diode,"*Appl. Phys. Lett.*, Vol. 56, No. 20, pp.

1942–1945 (May 14, 1990), which are incorporated herein by reference.

As shown in FIG. 3, spacer layer 20 lies between the mirror layers 10 and 50 and the active layer 30. In the material system illustrated in FIG. 2 and as shown in FIG. 3, spacer layer 20 comprises a plurality of layers of AlGaInP with progressively increasing amounts of Ga toward the active layer 30. This graded region, however, is not required. It is possible to use alternate designs making use of the same materials. As is known in the art, these layers are lattice matched to GaAs. Also as is known, the index of refraction of these layers increases with increasing amounts of Ga and the bandgap decreases. As shown in FIG. 3, spacer layer 40 is similar in construction with progressively decreasing amounts of Ga toward mirror layer 50. Again, a graded region of the spacer layer 40 is not required; and it is possible to use alternate designs making use of the same materials. It is also advantageous to lightly dope the interfaces between the optical cavity and the DBR with the same type doping that is increasingly found in the layers above or below the optical cavity.

Figure 4:
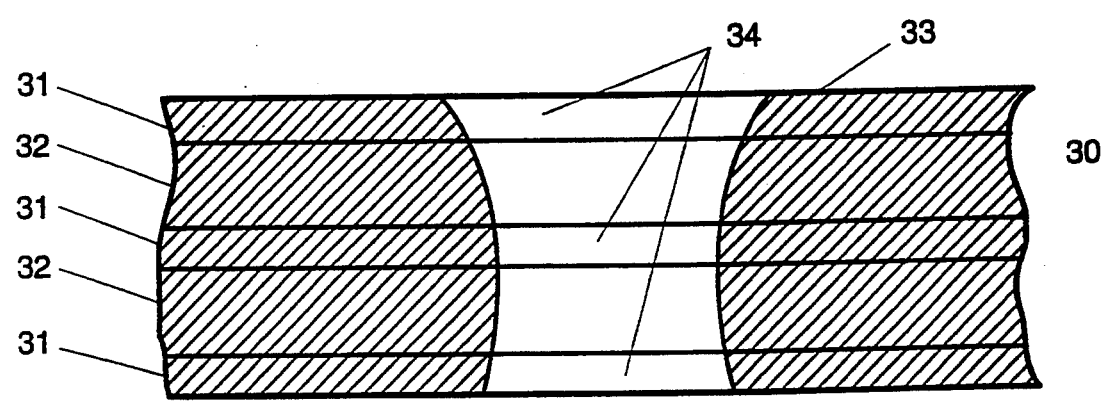

As shown in FIG. 4, if the active layer 30 is a quantum well layer, it comprises several layers, with two to four layers being typical. As is illustrated in FIG. 4, approximately 50–100 Angstrom thick layers 31 of GaInP are separated by two approximately 50–100 Angstrom thick barrier layers 32 of AlGaInP. The thickness and detailed structure of these layers are tailored to achieve the highest optical gain and desired wavelength. The composition of $In_z(Al_yGa_{1-y})_{1-z}P$ for the active region and $In(Al_yGa_{1-y})_{1-z}P$ where z is approximately 0.5 will result in emission wavelengths in the red region. Moreover, for certain wavelengths y can be equal to zero; as the percentage of Al increases, the bandgap also increases and the wavelength will decrease. The quantum wells in the active layer 30 may either be compressively or tensilely strained to modify the energy-momentum dispersion relationship to reduce the number of carriers required to achieve lasing action, and for the $In_xGa_{1-x}P$ material system, $x=0.483$ for a system with no strain.

A peripheral zone 33 of protons is formed in the active layer 30 by implantation. This zone limits the active bulk region or quantum well to those portions 34 of layers 31 where protons are not implanted. Peripheral zone 33 also confines current flow through the laser diode to the portions of layers 31 and 32 where protons are not implanted and, therefore, increases current density through the bulk region or quantum well. Confining the current flow through the portions 34 of the active layer 30 may also be accomplished by the use of etched posts. As shown in FIG. 6, individual lasers are formed by defining the devices photolithographically and etching them using known gaseous or chemical etchants.

Figure 5:
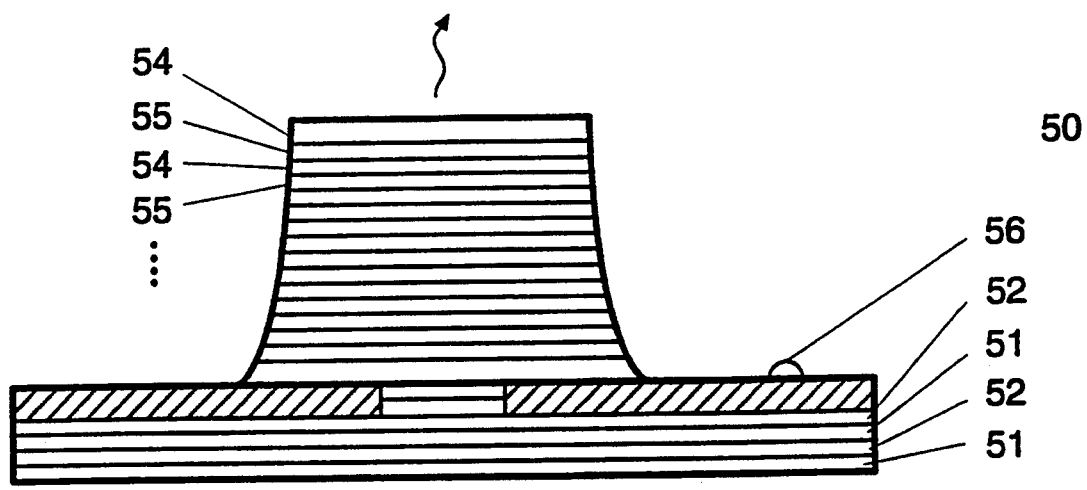

Actually, two structural designs may be used in the second mirror layer 50. First, the second mirror layer 50 could comprise multiple semiconductor doped layers of alternating AlAs/AlGaAs or InAlP/InAlGaP or hybrids between the two material systems. These multiple alternating layers, however, have a high resistivity. Therefore, as an alternative, to decrease the resistivity, fewer semiconductor doped layers are used, and then a stack of appropriate dielectrics may be used as described above. In either case, i.e., whether multiple stacks of semiconductor doped layers of alternating AlAs/AlGaAs or InAlP/InAlGaP, or using fewer stacks of the layers and then incorporating stacks of dielectric materials, the layers alternate between one layer with a high index of refraction and then next layer being one with a low index of refraction, with a layer having a low index of refraction immediately adjacent the active region. As shown in FIG. 5, second mirror layer 50 comprises a plurality of alternating layers 51, 52 of p+ doped AlAs and AlGaAs, or p+ doped InAlP and InAlGaP, a peripheral electrical contact layer 53 of Au and a plurality of alternating layers 54, 55 of a suitable dielectric, which may be $TiO_2$ and $SiO_2$. If the DBR is comprised of multiple layers of dielectric materials, preferably the electrical contact is made at the spacer/DBR interface, rather than through the top of the upper DBR.

Good results with respect to transition between the active region and the DBR, electrical injection of the laser and a variety of material systems has been obtained when the layer immediately adjacent the active region is InAlP. Again, each of layers 21 and 52 and layers 54 and 55 are a quarter-wavelength thick and these layers constitute a distributed Bragg reflector. The reflector, however, is partially transmissive to provide for emission of laser radiation from the uppermost layer. Advantageously, the enter hole in contact layer 53 is dimensioned so as to restrict the propagation modes of the emitted laser radiation to the $TEM_{oo}$ mode.

Preferably, as shown in the top-view of FIG. 6, electrical contact with contact layer 53 is made in conventional fashion through a bonding pad 56 which is formed at the same time as layer 53 on a portion 72 of the epitaxial layers immediately adjacent to the portion 71 of those layers illustrated in FIGS. 2–7.

If desired, the construction of second mirror layer 50 could be the same as that of layer 10. However, the layers of AlAs and AlGaAs or InAlP/InAlGaP have relatively high resistance which results in unwanted heating of the second mirror layer. Accordingly, it is advantageous to reduce the resistance of the second mirror layer by including only a few layers of 51, 52 of the mirror within the diode regions between electrical contact layer 53 and substrate 60. The remaining layers of the second mirror are formed by dielectric deposition of alternating $TiO_2$ and $SiO_2$ layers on top of contact layer 53.

A visible light emitting diode can be accomplished with the materials and choice of designs above with the exception that while one of the mirror stacks would have multiple layers, the mirror stack on the other side of the active optical region would have fewer stacks than would be required to achieve lasing action.

With appropriate selection of materials and layer dimensions, the laser of FIGS. 1–8 can be used to generate laser radiation in different portions of the visible region of the spectrum. The specific embodiment described in conjunction with FIGS. 1–8 can be used to generate radiation in the orange and red region. For orange and yellow wavelengths, it may also be possible to use InAlGaP materials in a manner similar to the red light emitting device. The AlGaP/AlP materials may be desirable for green and yellow wavelengths.

Numerous variations in the invention will be apparent to those skilled in the art from the foregoing description. For example, other material combination from the III–V and II–VI semiconductor groups such as ZnCdSe can be used in place of the materials specified for the quantum well or bulk layers, spacer layers and mirror layers.

What is claimed is:

1. In a vertical cavity surface emitting laser that emits visible radiation, comprising:
   (a) a substrate;
   (b) a first mirror comprising a plurality of sets formed on said substrate, each of said sets having a thickness of $\lambda/2n$ where n is the index of refraction of said set;
   (c) a first spacer, formed on said first mirror;
   (d) an active layer of the $In_z(Al_yGa_{1-y})_{1-z}P$ material system which emits radiation of wavelength $\lambda$ in the visible spectrum, said active layer formed on said first spacer;
   (e) a second spacer formed on said active layer; and
   (f) a second mirror comprising a plurality of sets formed on said second spacer, each of said sets having a thickness of $\lambda/2n$ where n is the index of refraction of said set;
   wherein said first and second mirrors define therebetween a laser cavity having a length equal to m $\lambda/2n_{eff}$ where m is an integer and $n_{eff}$ is the effective index of refraction of the laser cavity, and
   said second spacer and said second mirror being made of materials that are transmissive to radiation having a wavelength of $\lambda/n$.

2. The laser of claim 1, wherein said first and second spacers are also of the $In_z(Al_yGa_{1-y})_{1-z}P$ material system.

3. The laser of claim 1, wherein said active region and said first and second spacer layers consist of one of the following material systems: InAlGaAs; AlGaAs; or InGaAs.

4. The laser of claim 1, further comprising a layer of InAlP on each side of said active layer between said first and second spacer layers.

5. The laser of claim 1, wherein said set of said first and said second mirror further comprises a distributed Bragg reflector of one layer of quarter-wavelength thickness having a relative high index of refraction alternating with one layer of quarter-wavelength thickness having a relative low index of refraction, and wherein said layer having said relative low index of refraction is adjacent said active layer.

6. The laser of claim 5, wherein said sets of said first and said second mirrors are comprised of layers wherein the resistivity of said layers is reduced.

7. The laser of claim 6, wherein layers of said first and second mirrors are semiconductors.

8. The laser of claim 6, wherein said layers of said first and second mirrors are semiconductors.

9. A vertical cavity surface emitting laser that emits visible radiation, comprising:
   (a) a substrate;
   (b) a first mirror comprising a plurality of sets formed on said substrate, each of said sets having a thickness of $\lambda/2n$ where n is the index of refraction of said set;
   (c) a first spacer, formed on said first mirror;
   (d) an active layer of the $Al_yGa_{1-y}P$ material system which emits radiation of wavelength $\lambda$ in the visible spectrum, said active layer formed on said first spacer;
   (e) a second spacer formed on said active layer; and
   (f) a second mirror comprising a plurality of sets formed on said second spacer, each of said sets having a thickness of $\lambda/2n$ where n is the index of refraction of said set;
   wherein said first and second mirrors define therebetween a laser cavity having a length equal to m $\lambda/2n_{eff}$ where m is an integer and $n_{eff}$ is the effective index of refraction of the laser cavity, and
   said spacers and said mirrors and said active layers being of the AlGaP/GaP materials that are transmissive to radiation having a wavelength of $\lambda/n$.

* * * * *